(12) United States Patent
Takane et al.

(10) Patent No.: US 7,166,840 B2
(45) Date of Patent: Jan. 23, 2007

(54) METHOD FOR DETERMINING DEPRESSION/PROTRUSION OF SAMPLE AND CHARGED PARTICLE BEAM APPARATUS THEREFOR

(75) Inventors: Atsushi Takane, Mito (JP); Satoru Yamaguchi, Hitachinaka (JP); Osamu Komuro, Hitachinaka (JP); Yasuhiko Ozawa, Abiko (JP); Hideo Todokoro, Hinode (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/056,191

(22) Filed: Feb. 14, 2005

(65) Prior Publication Data

US 2005/0151078 A1    Jul. 14, 2005

Related U.S. Application Data

(62) Division of application No. 10/192,692, filed on Jul. 11, 2002, now Pat. No. 6,872,943.

(30) Foreign Application Priority Data

Jul. 12, 2001   (JP)   .............................. 2001-211533
Jun. 7, 2002    (JP)   .............................. 2002-166447

(51) Int. Cl.
    *G01N 23/00*   (2006.01)
(52) U.S. Cl. ........................ 250/311; 250/310; 250/306
(58) Field of Classification Search .................... None
    See application file for complete search history.

(56) References Cited

U.S. PATENT DOCUMENTS

| | | | |
|---|---|---|---|
| 4,577,095 A | 3/1986 | Watanabe | |
| 4,990,776 A * | 2/1991 | Fushimi et al. | 250/310 |
| 5,557,105 A | 9/1996 | Honjo et al. | |
| 5,734,164 A | 3/1998 | Sanford | |
| 5,955,739 A | 9/1999 | Kawashima | |
| 6,067,164 A * | 5/2000 | Onoguchi et al. | 356/401 |
| 6,107,637 A * | 8/2000 | Watanabe et al. | 250/559.3 |
| 6,570,156 B1 | 5/2003 | Tsuneta et al. | |
| 6,627,887 B1 | 9/2003 | Dudley et al. | |
| 6,888,139 B1 * | 5/2005 | Tsuneta et al. | 250/311 |

FOREIGN PATENT DOCUMENTS

| | | |
|---|---|---|
| EP | 1-045-426 A2 | 10/2000 |
| EP | 1-045-425 A2 | 10/2002 |
| JP | 1-311551 | 12/1989 |
| JP | 5-41195 | 2/1993 |
| JP | 5-175496 | 7/1993 |

OTHER PUBLICATIONS

Japanese Office Action May 9, 2006 (and English translation of same).

* cited by examiner

*Primary Examiner*—Nikita Wells
*Assistant Examiner*—Anthony Quash
(74) *Attorney, Agent, or Firm*—Dickstein Shapiro LLP

(57) ABSTRACT

A method for determining a depression/protrusion, especially of a line and space pattern formed on a sample, and an apparatus therefor. A charged particle beam is scanned with its direction being inclined to the original optical axis of the charged particle beam or a sample stage is inclined, broadening of a detected signal in a line scanning direction of the charged particle beam is measured, the broadening is compared with that when the charged particle beam is scanned with its direction being parallel to the original optical axis of the charged particle beam, and a depression/protrusion of the scanned portion is determined on the basis of increase/decrease of the broadening.

4 Claims, 20 Drawing Sheets

| Comparison of half-widths | | Output profile | Depression/protrusion determination |
|---|---|---|---|
| HP1 ≦ HM1 | HP2 ≧ HM2 | 2 | Protrusion |
| | HP2 < HM2 | 1 | Flat (Determination is impossible) |
| HP1 > HM1 | HP2 ≧ HM2 | 1 | Flat (Determination is impossible) |
| | HP2 < HM2 | 0 | Depression |

FIG.9

[Right-above direction and +θ direction]

| Comparison of half-widths | | Depression/protrusion determination |
|---|---|---|
| HE1 ≦ HP1 | HE2 ≧ HP2 | Protrusion |
| | HE2 < HP2 | Flat (Determination is impossible) |
| HE1 > HP1 | HE2 ≧ HP2 | Flat (Determination is impossible) |
| | HE2 < HP2 | Depression |

[Right-above direction and −θ direction]

| Comparison of half-widths | | Depression/protrusion determination |
|---|---|---|
| HE1 ≦ HM1 | HE2 ≧ HM2 | Depression |
| | HE2 < HM2 | Flat (Determination is impossible) |
| HE1 > HM1 | HE2 ≧ HM2 | Flat (Determination is impossible) |
| | HE2 < HM2 | Protrusion |

FIG.14
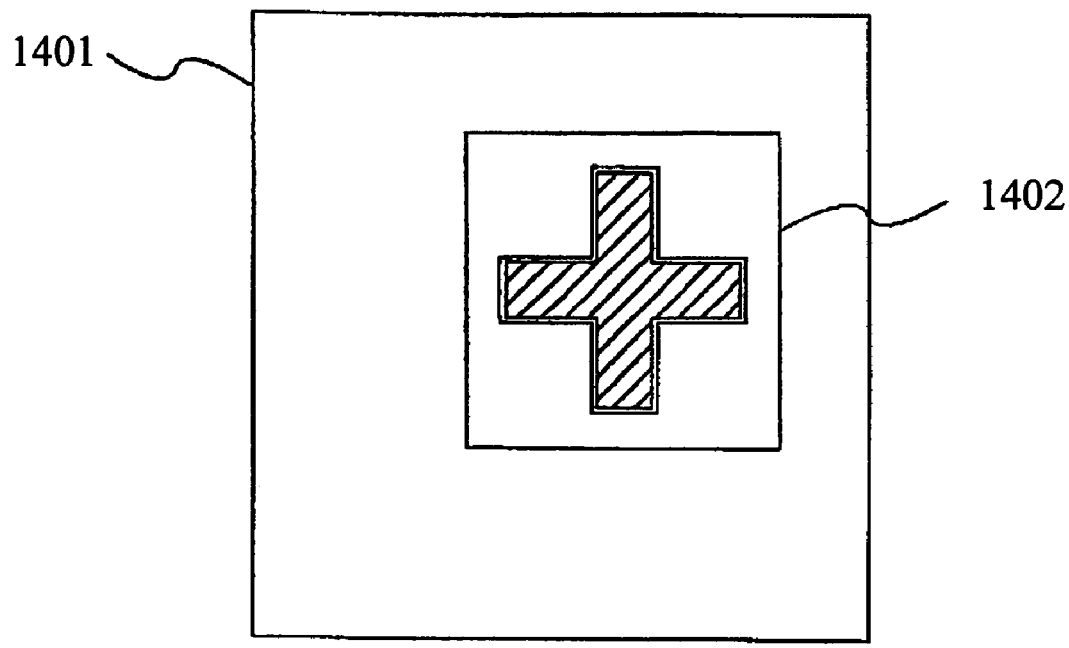
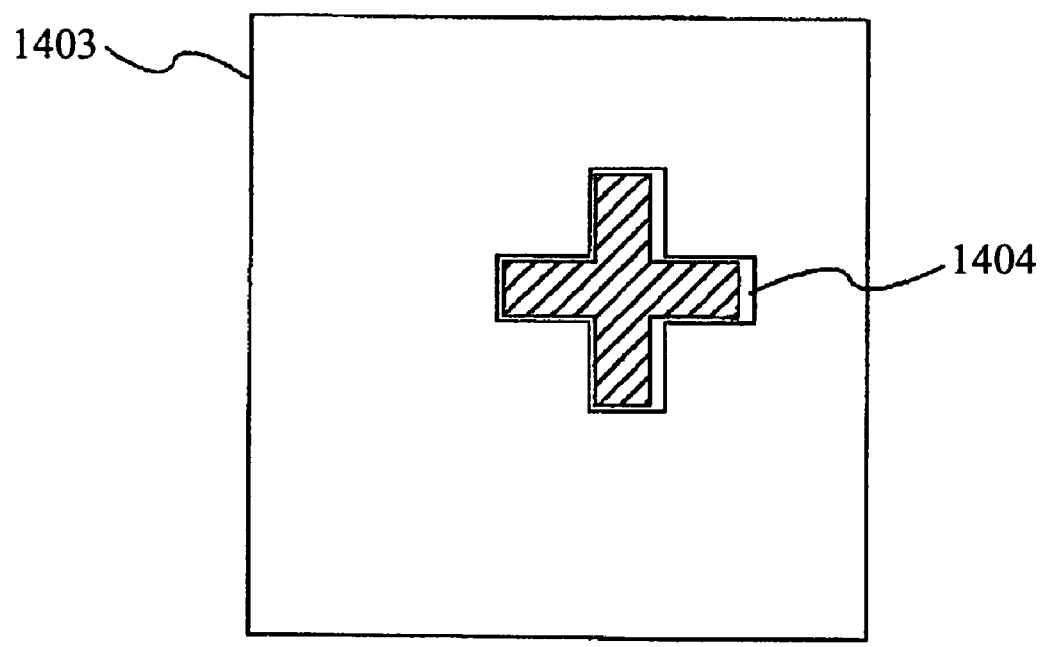

*FEnm: Focus evaluation value of region (m) of Gn image $$FEnm = \sum_m Gfn(x, y)$$

Focusing current of in-focus state in region (1)

$$\max(FE_{11} \sim FE_{n1}) = FE_{j1} \rightarrow F_j$$

Focusing current of in-focus state in region (2)

$$\max(FE_{12} \sim FE_{n2}) = FE_{j2} \rightarrow F_j$$

METHOD FOR DETERMINING DEPRESSION/PROTRUSION OF SAMPLE AND CHARGED PARTICLE BEAM APPARATUS THEREFOR

CROSS-REFERENCE TO RELATED APPLICATION

This application is a divisional of U.S. patent application Ser. No. 10/192,692, filed on Jul. 11, 2002, now U.S. Pat. No. 6,872,943 the subject matter of which is incorporated in its entirety by reference herein.

BACKGROUND OF THE INVENTION

The present invention relates to a method for determining a depression/protrusion of a sample or a method for obtaining three-dimensional information of the same, more specifically relates to a suitable method for obtaining information of depressions and protrusions of a line and space pattern formed on a semiconductor wafer and an apparatus for the same.

Charged particle beam apparatuses, such as a scanning electron microscope, are suitable apparatuses for measuring and observing a pattern formed on the semiconductor that is developing toward further microfabrication. Conventionally, there is a stereoscopic observation method as disclosed in Japanese Unexamined Patent Publication No. H5-41195 (1993) as a method for obtaining three-dimensional information of a sample with the charged particle beam apparatus.

The stereoscopic observation method is a method in which two stereoscopic images are taken obliquely, stereoscopic matching is conducted between the two images to find corresponding points and thereby calculate the heights of those points, and thus three-dimensional information is obtained.

Further, Japanese Unexamined Patent Publication No. H5-175496 (1993) discloses a technology whereby a pattern on the sample is irradiated by a beam obliquely and dimensional measurement of the pattern is conducted.

SUMMARY OF THE INVENTION

There is a problem that, when the line and space pattern on the sample is subjected to length measurement with the scanning electron microscope, if the line width and the space width are almost equal, the determination of the line and the space is difficult and it may leads to erroneous determination. Further, in the above-mentioned stereoscopic matching, there is a problem that an excellent three-dimensional image is hard to obtain because of an insufficient S/N ratio and resolution of the image obtained by the scanning electron microscope, difficulty specific to the structure of the sample, etc. That is, if the S/N ratio or resolution is low, it is difficult to find the corresponding points with which the matching between the two images is established and consequently the method may give a blurred image in which the matching is not fully achieved. Further, since the stereoscopic matching method needs advanced image processing, there is also a problem that it takes a long processing time.

Incidentally, the technology disclosed by the Japanese Unexamined Patent Publication No. H5-175496 (1993) does not refer to determination of the line and space pattern.

It is the object of the present invention to perform determination of depressions and protrusions formed on the sample or obtain three-dimensional information thereof by a simple technique, more specifically to provide a suitable method for determining a depression/protrusion for the line and space pattern formed on a sample and an apparatus therefor.

In the present invention, the charged particle beam is scanned over the sample with its direction being inclined to the original optical axis of the charged particle beam, based on detection of the charged particles emitted from the scanned portion, broadening of the detected signal in a line scanning direction of the above-mentioned charged particle beam is measured, the broadening is compared with the above-mentioned broadening obtained when the above-mentioned charged particle beam was scanned with its direction being in parallel to the above-mentioned optical axis, and on the basis of increase/decrease of the broadening a depression/protrusion state of the above-mentioned scanned portion is determined.

With the configuration as mentioned above, it becomes easy to perform depression/protrusion determination in the image of the charge particle beam, especially becomes easy to judge a depression/protrusion state of a pattern in which similar unit patterns, such as the line and space pattern, continue.

Note that other objects of the present invention and other concrete configurations will be described in the paragraph of "PREFERRED EMBODIMENTS OF THE INVENTION below.

BRIEF DESCRIPTION OF THE DRAWINGS

FIG. 9 is a view explaining the method for determining a depression/protrusion that uses profiles taken from the right-above direction and from either of the positive direction or the negative direction.

FIG. 14 is a view illustrating an example where the pattern edges are enhanced by inclination of the beams from a plurality of directions.

DETAILED DESCRIPTION OF THE PREFERRED EMBODIMENTS

Figures 3, 4:
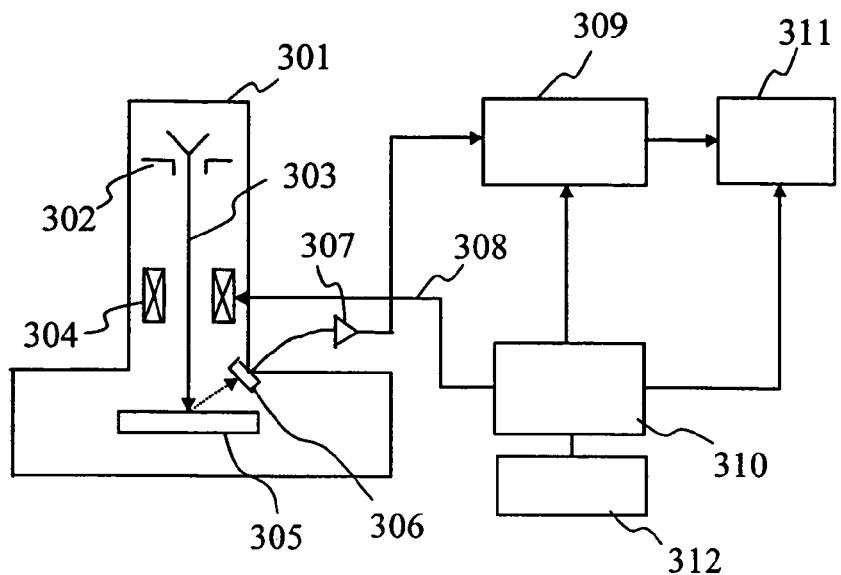
FIG. 3 is a schematic diagram of the scanning electron microscope that is one embodiment according to the present invention.
FIG. 4 is a view explaining the method for determining a depression/protrusion using profiles taken from $+\theta$ direction and from $-\theta$ direction.

FIG. 3 is the block diagram showing a configuration outline of the electron microscope apparatus that is one embodiment of the image processing apparatus according to the present invention. The numeral 301 represents a microscope body section of an electron microscope, in which an electron beam 303 emitted from an electron gun 302 is converged by the electron lens not shown in the figure and is irradiated on the sample 305. The intensity of secondary electrons generated from a sample surface or reflected electrons due to electron beam irradiation is detected by an electronic detector 306 and is amplified by an amplifier 307.

The numeral 304 represents a deflector for moving the position of the electron beam and capable of making the electron beam conduct raster scanning on the sample surface by a control signal 308 of a control computer (in this invention also called "control processor" or "control system") 310. A signal outputted from the amplifier 307 is subjected to A/D conversion in an image processor 309 to form digital image data. Further, a profile is formed from the digital image data by projection processing. Hereinafter, a digital signal waveform is also called a profile.

The numeral 311 represents a display device for displaying the image data. Further, the numeral 309 represents an image processor that has image memory for storing the digital image data, conducts various image processing, and comprises a display control circuit for controlling the display. To the control computer 310, input means 312 such as a keyboard and a mouse is connected.

In manufacturing a semiconductor device, when a line width of a fine pattern drawn on a wafer is measured, the electron microscope apparatus is used. Here, when the portion on the wafer that is to be measured for its line width is a line or a space, if the widths of the line and of the space are almost the same, it becomes difficult to distinguish the two features and it is necessary to distinguish them from three-dimensional information. This embodiment relates to the scanning electron microscope capable of obtaining three-dimensional information of the line and space sample by a simple technique. However, naturally this embodiment is not limited to it, but can be applied to other charged particle beam apparatuses, for example, a focused ion beam system etc.

Note that an address signal corresponding to a memory location of the image memory is generated in the control computer 310 and is supplied to a deflector 304 after being converted to an analog signal via a scanning coil control power source (not shown in the figure). The address signal in an X direction is a digital signal that takes 0 through 512 repeatedly, in the case of the image memory comprising 512×512 pixels; the address signal in a Y direction is a digital signal that is incremented by unity each time the address signal in the X direction reaches 512 from 0, taking 0 through 512 repeatedly. These signals are converted to analog signals.

Since the addresses of the image memory correspond to the addresses of deflection signals used for deflecting the electron beam, a two-dimensional image of a deflection area of the election beam by the deflector 304 is recorded in the image memory. Incidentally, signals in the image memory can be read out in chronological order by a read-out address generation circuit (not shown in the figure) that is synchronized by a read-out clock. The signal read out corresponding to the address is subjected to analog conversion to become brightness modulation signal of the display device 311.

The image memory is equipped with a function of memorizing images (i.e., image data) in a superimposing manner (i.e., superimposing one image on another and memorizing it) for the purpose of improving the S/N ratio. For example, images obtained by 8 times of the two-dimensional scanning are superimposed and memorized, and thereby one completed image is formed. That is, by superimposing images formed in one or more units of X-Y scanning, a final image is formed. The number of images for forming one frame of completed image (frame integral number) can be set up arbitrarily, and a proper value is set up in view of conditions of the secondary electron generation efficiency etc. Further, plural frames of images, each of which is formed by superimposing plural frames of images, are further superimposed and thereby an image that the operator wishes to acquire finally can be formed. At the time when a desired number of images have been memorized or just after that time, blanking of the first electron beam may be executed so that inputting information into the image memory is interrupted.

The sample 305 is placed on the stage not shown in the figure and can be moved in two directions (X direction and Y direction) in a plane perpendicular to the electron beam.

The apparatus of the embodiment according to the present invention is also equipped with a function of forming a line profile based on the detected secondary electrons or reflected electrons. The line profile is the one that is formed based on the amount of detected electrons when the first electron beam is scanned one-dimensionally or two-dimensionally or on brightness information of the sample image, etc. and the obtained line profile is used for, for example, dimensional measurement etc. of a pattern formed on the semiconductor wafer.

Note that in the explanation of FIG. 3, the control computer shall be integrated in the scanning electron microscope as one body or shall take other equivalent form. However, it is natural that the control computer is not limited to take such forms and that a control processor provided separately from the scanning electron microscope body section may perform such processing as will be described in the following. In that case, there become necessary a transmission medium that transmits detected signals detected by a secondary signal detector 13 to the control processor and transmits signals from the control processor to a lens, a deflector, etc. of the scanning electron microscope as well as an input/output terminal to/from which signals transmitted via the transmission medium are inputted/outputted.

Moreover, a program to execute processing described below may be registered on a storage medium, and the apparatus may be configured to execute the program with a control processor that has image memory and supplies necessary signals to the scanning electron microscope.

[Embodiment 1]

Figure 1:
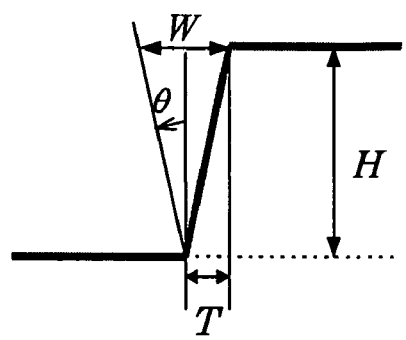
FIG. 1 is a diagram illustration showing variation in a signal of an edge in a line profile at the time of measurement with the inclined beam.

FIG. 1 is for illustrating variation in the height of an area corresponding to a peak in the edge profile at the time of measurement of a line image with the inclined beam. Note that in the embodiment described bellow, an example wherein the electron beam is inclined with reference to the original optical axis of the electron beam by means of the deflector 304 will be explained. However, the apparatus is not limited to this, and the apparatus may be modified so that the sample to be irradiated by the electron beam is inclined and thereby the electron beam is scanned over the sample obliquely to the normal to the sample surface. In this case, a sample stage having a tilting function may be used or the microscope's lens-barrel itself may be inclined. Further, a deflector separate from the scanning deflector may be used to incline the electron beam.

As shown in FIG. 1, an apparent width W as a function of the amount of inclination (an angle that the electron beam forms with the normal to the sample surface) θ is obtained by an expression (1) using a width of a ramp area T and a step height H. Further, if paying attention only to variation of the apparent width of the ramp area when the beam or the sample is inclined, it depends on only the step height H.

$$W = T + H * \tan\theta \quad (1)$$

Figure 2:
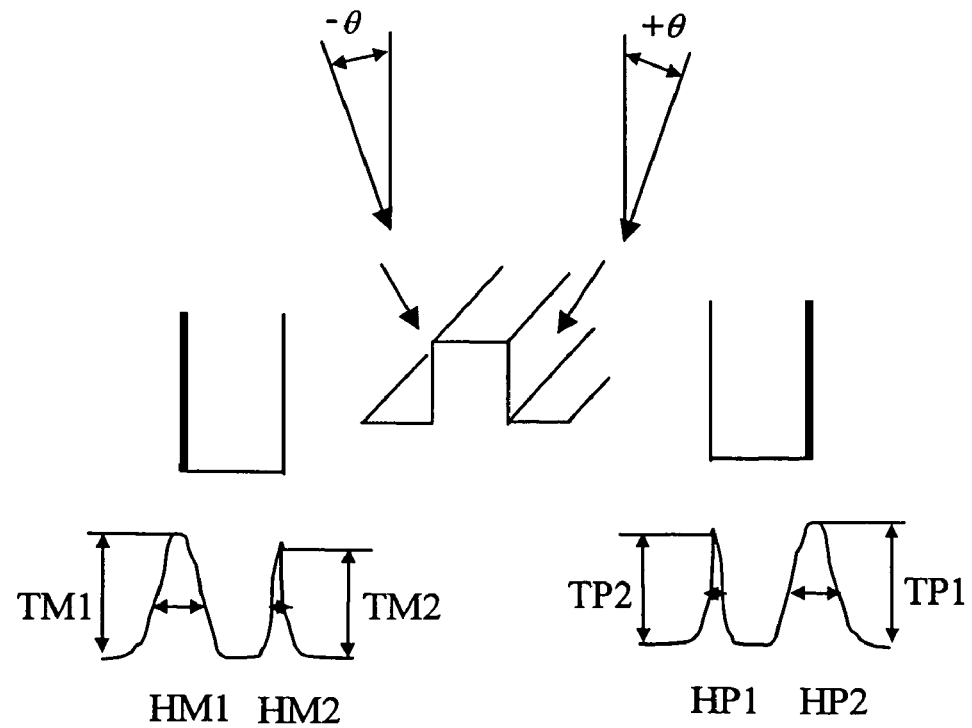
FIG. 2 is a view showing profile changes when a protrusion part is photographed from directions at an angle of $+\theta$ and at an angle of $-\theta$.

FIG. 2 shows change of the profile when the protrusion part is photographed from +θ direction and from −θ direction. Here, half-widths for +θ projection are represented by HP1 and HP2, and those for −θ projection are represented by HM1 and HM2, respectively. When the image is taken from −θ direction, the half-width of a signal of the left-hand side edge portion (HM1) becomes larger; when the image is taken from +θ direction, the half-width of a signal of the right-hand side edge portion (HM2) becomes larger. Note that, in this embodiment, the half-width of the peak is chosen as a measure. However, the measure is not limited to this, and a width at any height of the peak may be used as long as the length increases or decreases according to the inclination of the electron beam.

Thus the half-width of the signal of the edge facing the photographing direction becomes larger, and consequently the use of this phenomenon makes it possible to perform the depression/protrusion determination of the line and space pattern on the basis of increase/decrease of the half-width.

That is, if the width of the profile obtained in the scanning direction of the electron beam when the electron beam is inclined with reference to the original optical axis of the electron beam becomes larger as compared with that in the absence of the inclination, it can be judged that there exists a part whose side face (edge) is formed so as to face the inclination direction of the electron beam at a portion corresponding to the profile. In other words, when the broadening of the detected signal in the line scanning direction (i.e., X direction in the case of two-dimensional scanning) is measured, if the above-mentioned broadening become larger as compared with the case where the electron beam is irradiated in parallel to the direction of the original optical axis, the edge side face exists so as to face the inclination direction of the electron beam.

Conversely, if the width of the profile becomes smaller, it can be judged that the edge is a portion existing at a reverse side (other side) to the inclination direction of the electron beam. In other words, when the electron beam is scanned with its direction being inclined and two peaks appear, if the width of one of the two peaks becomes larger and the width of the other peak becomes smaller, it is found that there exists a depression or protrusion between two positions corresponding the two peaks. Further, it can be judged that, if a peak whose width increases exists in a side toward which the electron beam is inclined, the protrusion exists and that, if a peak whose width decreases exists in a side toward which the electron beam is inclined, the depression exists.

According to the apparatus with the above configuration, the depression/protrusion determination on the sample becomes possible even without adopting a complex image processing technology. Further, since the depression/protrusion determination can be performed by a simple method in which the line profile is formed, as compared with image processing, the method can easily be integrated in automatic measurement of semiconductor test equipment and it is effective for improvement of throughput of an inspection process.

Especially, it becomes easy to judge a depression/protrusion state of a pattern in which similar unit patterns, such as the line and space pattern, continue. Moreover, regardless of a material composition that makes up the line and space pattern, accurate depression/protrusion determination can be performed. That is, even in cases where there is no difference in quality of image between the line and the space, accurate depression/protrusion determination can be performed.

[Embodiment 2]

In this embodiment, an example wherein the scanning not only from a single direction but at least from both directions, +θ direction and −θ direction, is executed as a technique for further improving accuracy of the depression/protrusion determination will be described.

In the case where the half-widths of the signals of right and left edges are originally different from each other due to the electron beam or in other cases, there may be cases where it is difficult to judge the increase/decrease of the half-width only by scanning with the inclined beam from one direction. However, if the profiles taken from +θ direction and from −θ direction are compared, the determination can easily be performed because the increase/decrease of the half-widths for the right and left edges exhibit reverse behavior.

FIG. 4 is a view for illustrating the method for determining a depression/protrusion using profiles taken from ±θ directions. If the following scheme is adopted: when the HM1 (first peak) has a width equal to or larger than that of the HP1 (third peak), if it is judged that the HP2 (fourth peak) has a width equal to or larger than that of the HM2 (second peak), the pattern is determined to be a protrusion pattern; and when the HM1 (first peak) has a width smaller than that of the HP1 (third peak), if it is judged that the HP2 (fourth peak) has a width smaller than that of the HM2 (second peak), the pattern is determined to be a depression pattern; then it becomes possible to perform high-accuracy, depression/protrusion determination of the line and space pattern as described above. Note that, in this embodiment explained was an example in which the depression/protrusion inference for a portion between positions corresponding to the two peaks is performed when HP1≦HM1 and HP2≧HM2 and when HP1>HM1 and HP2<HM2, but the embodiment is not limited to this, and, for example, it may be judged as follows: if HP1<HM1 and HP2>HM2 are satisfied, then the portion is determined to be a protrusion, and if HP1≧HM1 and HP2≦HM2 are satisfied, then the portion is determined to be a depression. This also stands in the embodiment described later.

Further, although depending on a pattern, determination can be performed by using the heights of the right and left edges ((TM1 and TM2) and (TP1 and TP2)) in the profile. Alternately, it is also possible to use a value of the product of the half-width by the height (HM1*TM1) or an area.

[Embodiment 3]

Figure 13:
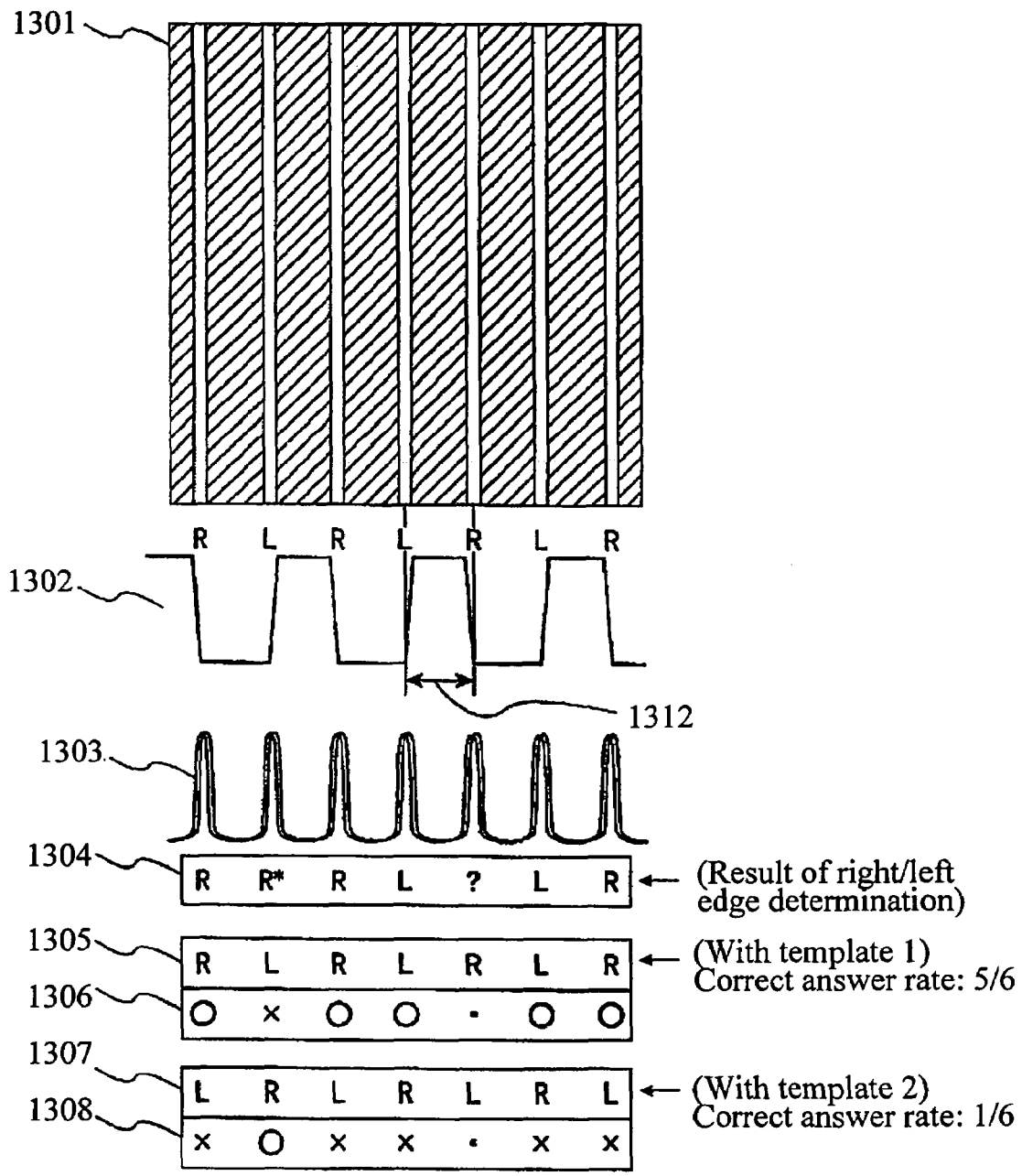
FIG. 13 is a view illustrating the method for determining a depression/protrusion that uses templates.

Next, more preferable method for determining a depression/protrusion in the case where there are a plurality of line and space patterns and each line and each space are given equal widths will be described referring to FIG. 13.

An image 1301 is the one such that contrast of the scanning electron microscope image is obtained only by an edge effect and that was taken by scanning the electron beam from the right-above direction. A pattern that needs the depression/protrusion determination is a pattern like this. When a measurement position (characteristic portion) that should come in the center of the image is shifted, for example, to be a measurement position 1312 in a pattern cross section 1302 due to control error of the apparatus or difference in a pattern shape, it is difficult to recognize the measurement position 1312 from the image 1301.

To circumvent the problem, whether each edge is a right edge or a left edge of the line pattern is determined by using the half-widths and the peak heights extracted from two profiles 1303 that were obtained with the electron beam inclined by ±θ with reference to a vertical direction by the above-mentioned method.

For example, suppose that a result of the right/left edge determination for seven edges became as shown in a small diagram 1304. Here, the symbol R represents the right edge and the symbol L represents the left edge. The symbol "?" indicates a case where the determination was impossible because of absence of differences in the half-width and in the peak height. Further, the symbol R* in the diagram 1304 represents an example where the edges is erroneously judged due to irregularity of the pattern shape and noises.

Next, based on assumption that the pattern to be recognized is the line and space pattern, two templates 1305 and 1307 each covering seven edges are formed. The templates are compared with the result of the right/left edge determination (1304), and the template that provides more correct answers (here, the template 1305) is assumed right and is chosen. That is, the template for specifying conditions (in this embodiment, arrangement of the line and the space) that gives a higher correct answer rate is used to specify the characteristic portion on the above-mentioned sample. An edge marked with "?" that was not able to be determined using the template assumed correct and an erroneously determined edge can be corrected. According to this method, since a depression/protrusion is determined with a plurality of edges, reliability of the depression/protrusion determination can be increased.

Note that, this embodiment was explained for an example wherein the template for the line and space pattern such that the line and the space continues alternately was used, but that the embodiments are not limited to this, and as long as a pattern comprises depressions and protrusions, the depression/protrusion determination on the sample can be checked by forming suitable templates. Note further that, in this embodiment, an example wherein the templates were two was explained, but the number of templates may be three or more.

[Embodiment 4]

In the embodiment 3, a method whereby information of the edge that cannot be judged is inferred by referring to the templates was described. However, if the correct answer rates in the determination when either of the templates 1 and 2 is applied are both high or both low, it is likely that a problem may be in optical conditions of the scanning electron microscope or in the line and space pattern itself. The correct answer rate-based technology of determining a depression/protrusion using the template that was described in the embodiment 3 should demonstrate a tendency that either of the templates gives a high score for the correct answer rate and the other gives a low score therefor principally. That is, when the correct answer rate is high or low for both templates, it is likely that a problem may be in the optical conditions of the scanning electron microscope or in the line and space pattern itself.

In cases like this, if such a sequence is built in the apparatus that the results of the edge determination of the left and right peaks are memorized being associated with at least one of the line profile, the image by the scanning electron microscope, the optical conditions of the scanning electron microscope, manufacture history of the semiconductor wafer, etc. so that they can be read out thereafter, it will make easy to seek after a cause of erroneous determination.

When the depression/protrusion determination is turned to be unsuccessful, it is often the case that further measurement is difficult to conduct; therefore, an error message may be issued to call the operator's attention. Further, if the sample is such a sample as has a lot of measurement points or observation points like the semiconductor wafer, measurement and observation of a portion at which the error occurred may be skipped and next measurement or observation may be set about.

Moreover, in the case of the semiconductor wafer in which portions on which determination cannot be performed count two or more, it is likely that there is a certain problem with the scanning microscope or the whole wafer suffers the same problem; therefore, the measurement or observation by that scanning electron microscope may be interrupted or the measurement or observation of that semiconductor wafer may be halted.

Figure 15:
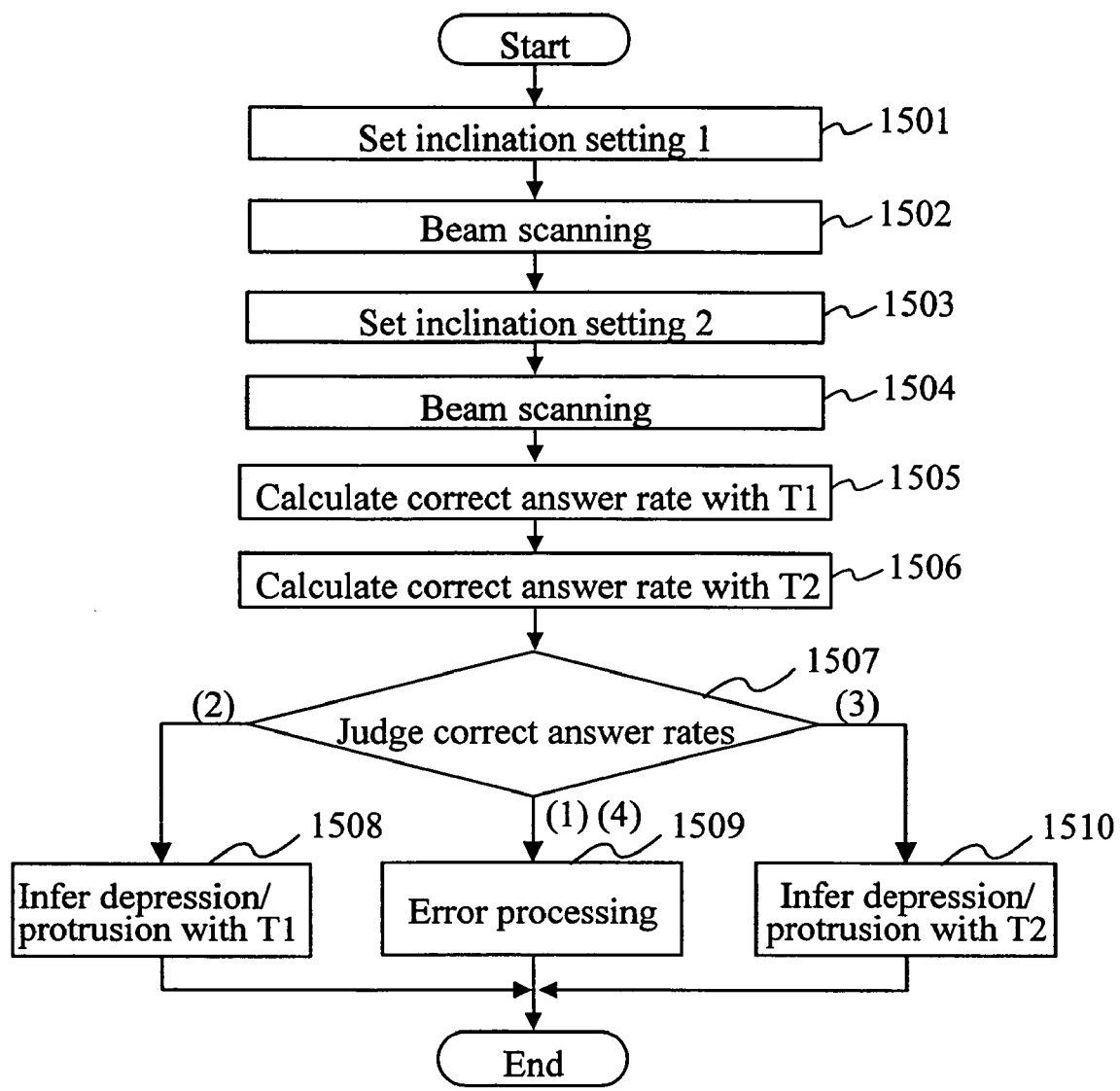
FIG. 15 is a processing flow for the depression/protrusion determination with the template.

FIG. 15 is a processing flow of the depression/protrusion determination by means of the template.

At steps 1501 to 1504, the electron beam is scanned so that a line profile in a direction perpendicular to an edge direction of the line and space pattern can be formed. In this embodiment, the depression/protrusion determination by electron beam scanning from ±θ directions explained in the embodiment 2 is performed. At step 1505, the correct answer rate with the template 1 is calculated. At step 1506, the correct answer rate with the template 2 is calculated.

At this stage, if the correct answer rate T1 with the template 1 is equal to or more than a prescribed value n1 and the correct answer rate T2 with the template 2 is less than n2 (see (2) in the lower table of FIG. 15), the actual pattern is determined to be a pattern indicated by the template 1 (step 1508). Further, if the correct answer rate T1 with the template 1 is less than a prescribed value n1 and the correct answer rate T2 with the template 2 is equal to or more than n2 (see (3) in the lower table of FIG. 15), the actual pattern is determined to be a pattern indicated by the template 2 (step 1509). When the correct answer rate does not hold true in either of the above-mentioned two conditions (see (1) and (4) in the lower table of FIG. 15), the flow judges the case to be incapable measurement and executes error processing (step 1509).

In the above-mentioned embodiment, any one of the templates (e.g., template 1) is for a pattern to be judged and the other template specifies a shape different from that of the one template. By selection of information (line profile, image data, etc.) with the template that specifies a different shape or conditions (image data etc.), accuracy of the determination can be increased further.

In the case where the flow judges the situation to be as (1) or (4) in the lower table of FIG. 15, if such a sequence is built in the apparatus that the results of the edge determination of the left and right peaks are memorized being associated with the line profile, the image by the scanning electron microscope, the optical conditions of the scanning electron microscope, manufacture history of the semiconductor wafer, or the like as described above so that they can be read out thereafter, it will make easy to specify a cause of the failure in the pattern inference, facilitating its feedback to a measurement process or manufacture process thereafter.

Especially, there can be conceived a case where the line patterns are formed continuously with its shape being inclined to the same direction, for example, a case where equipment conditions of optical exposure equipment in a semiconductor manufacture line are erroneously set up. Therefore, if the fact is memorized as incidental information, cause specification can be conducted more easily. The state where the pattern shapes are inclined to a specific direction can be found by knowing the presence of a phenomenon that, only when the electron beam is irradiated on the sample from one of the inclination directions, the half-width of the profile formed by the pattern edge facing that inclination direction is widened.

[Embodiment 5]

Figure 5:
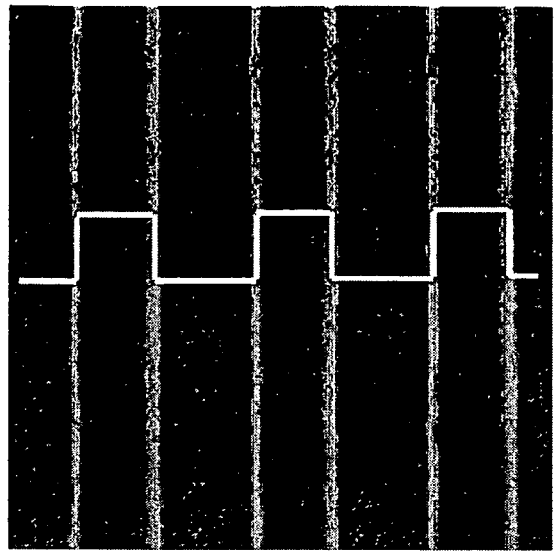
FIG. 5 is a view showing an example in which the obtained depression-and-protrusion profile is displayed superimposed on the photographed image.
Figure 6:
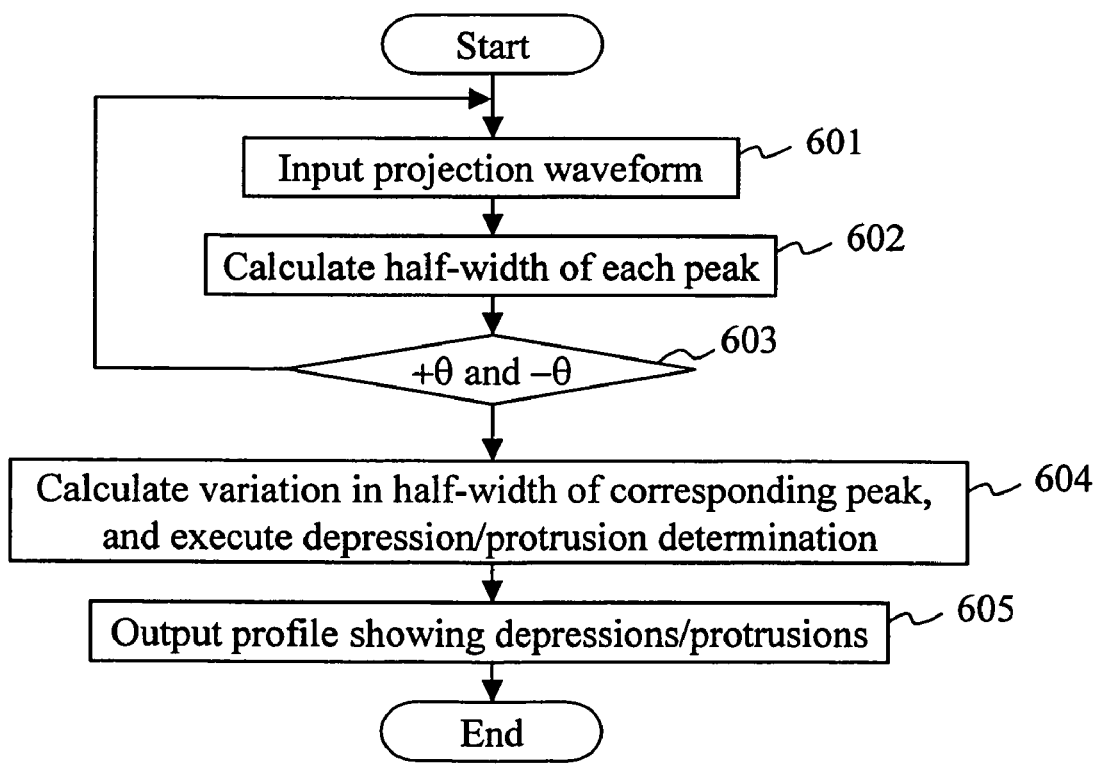
FIG. 6 is a processing flow of the depression/protrusion determination of a line and space image.

FIG. 5 is an example in which the obtained depression-and-protrusion profile is displayed superimposed on a photographed image. If the depression-and-protrusion profile is displayed in this way, the determination of the line or space can easily be performed on a sample image on which it is difficult to perform the depression/protrusion determination using only the scanning electron microscope image. FIG. 6 is a processing flow of the depression/protrusion determination of the line and space image. At step 601, the projection waveform taken in one of inclination directions is inputted, and at step 602 the half-widths of the peaks are calculated. At step 603, determination is done so that processing in steps 601 to 602 is performed for the projection waveforms obtained by the election beams from ±θ directions. At step 604, variation between the half-widths of the corresponding peaks of the profiles taken with the electron beams from ±θ directions is calculated and, from this variation, the depression/protrusion determination is performed by the determination method shown in FIG. 4. At step 605, a profile showing the depressions and protrusions is outputted.

[Embodiment 6]

Figure 7:
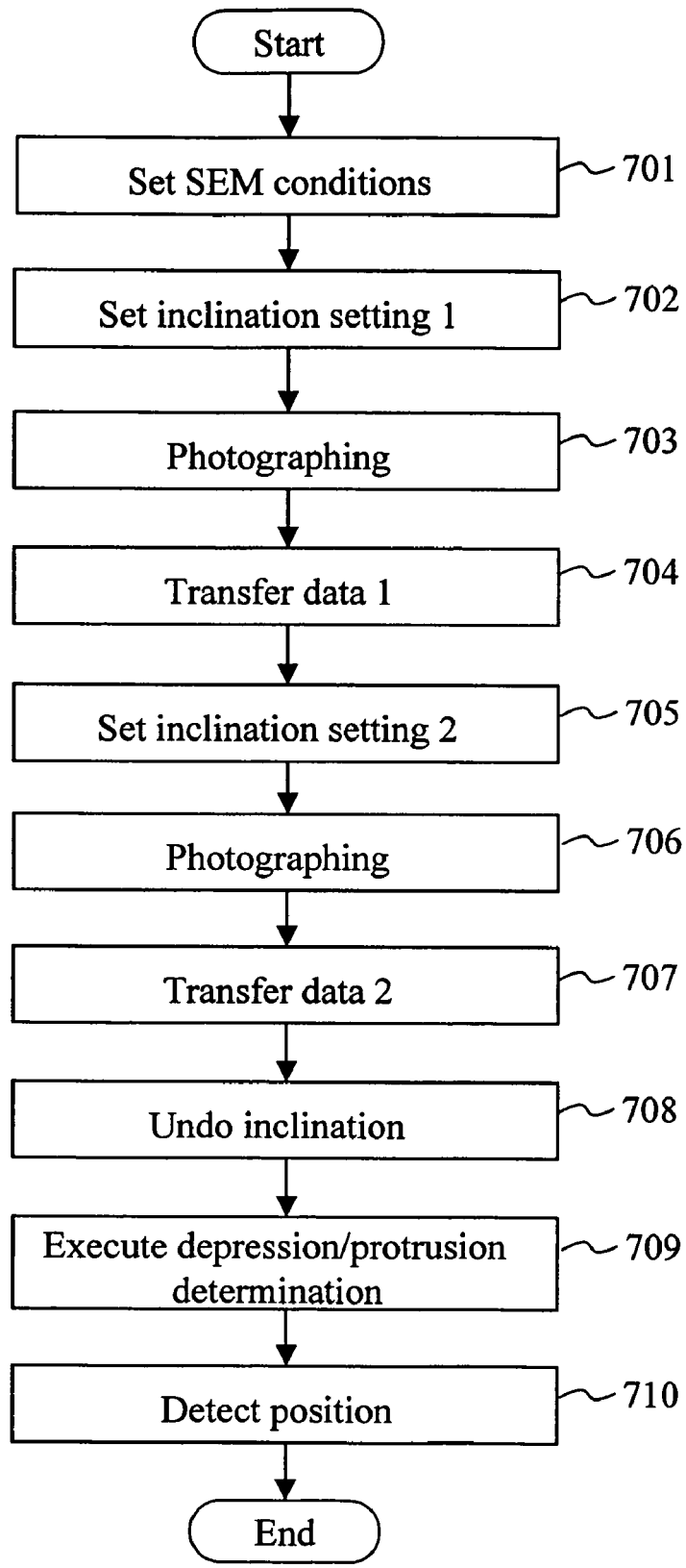
FIG. 7 is a processing flow in the case where the present invention is used for position specification of a line or space.

FIG. 7 is a processing flow in the case where the present invention is used for the position specification of the line or space when the length measurement is conducted in the line and space image. At step 701, the measurement conditions of the scanning electron microscope (SEM) are set up, and at step 702 the beam irradiation angle or the stage angle is inclined by +θ angle. At step 703, an image is taken. Since the depression/protrusion determination uses the projection waveform, the photographing here may be such that the whole of one frame image is taken or that data of several lines are measured. At the step 704, the data measured at step 703 is transferred to an image processor. At step 705, the beam irradiation angle or the stage angle is inclined by −θ by the same method as of step 702, at step 706 an image is taken, and at step 707 the data is transferred. At step 708, the inclination given at step 705 is put back. At step 709, the depression/protrusion determination is performed by the image processor from the data transferred at steps 704 and 707.

Finally, at step 710, if it is the line area, coordinates of the protrusion part are outputted, and if it is the space area, coordinates of a depression part are outputted. Here, if plural depression/protrusion parts were detected, coordinates that are closest to the center may be chosen to be outputted.

According to the above configuration, alignment of a field of view, the length measurement, and position adjustment for inspection can be conducted easily and accurately without using a complex image processing technology such as pattern matching.

[Embodiment 7]

Figure 8:
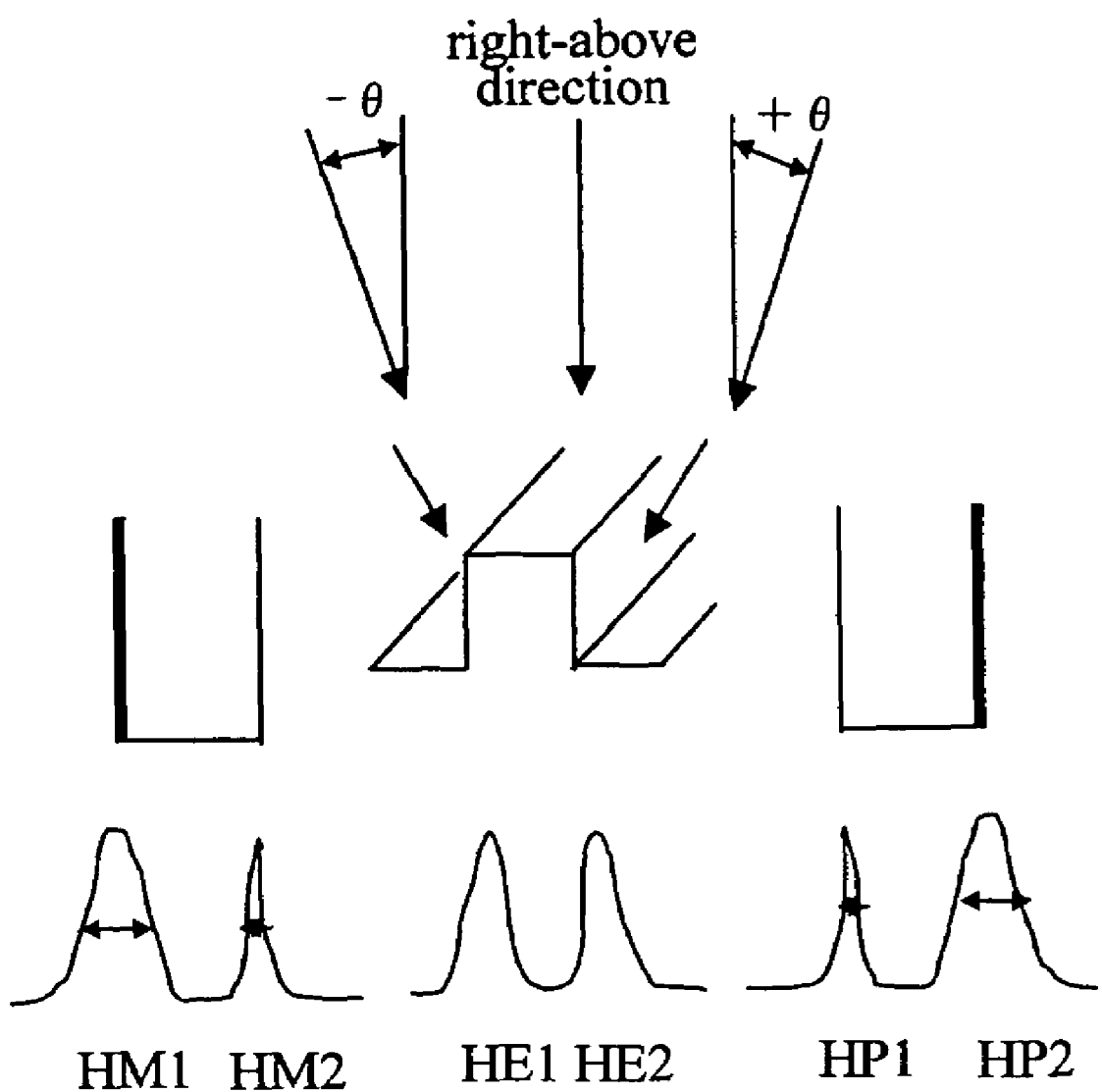
FIG. 8 is a view showing how the profile changes when the protrusion is photographed from the right-above direction, from $+\theta$ direction, and from $-\theta$ direction.

FIG. 8 shows change in the profile when the protrusion is photographed from the right-above direction, from +θ direction (a direction inclined by +θ angle with reference to the vertical direction), and from −θ direction (a direction inclined by −θ angle). Here, the half-widths of the right-above direction profile are designated by HE1 and HE2, the half-widths of +θ direction profile are designated by HP1 and HP2, and the half-widths of −θ direction profile are designated by HM1 and HM2, respectively.

As explained in FIG. 2, it becomes possible to perform the depression/protrusion determination that is difficult from the image taken from a single direction by comparing the change in the half-widths taken from two directions: the right-above direction and +θ direction or −θ direction. Further, in the case of this embodiment, since the depression/protrusion determination can be performed only by a single inclination, it becomes possible to improve the processing speed as compared with a case where the electron beam is inclined two times, to +θ direction and to −θ direction.

FIG. 9 explains the method for determining a depression/protrusion using the profiles taken from the right-above direction and from an either direction of the positive and negative directions.

Figure 10:
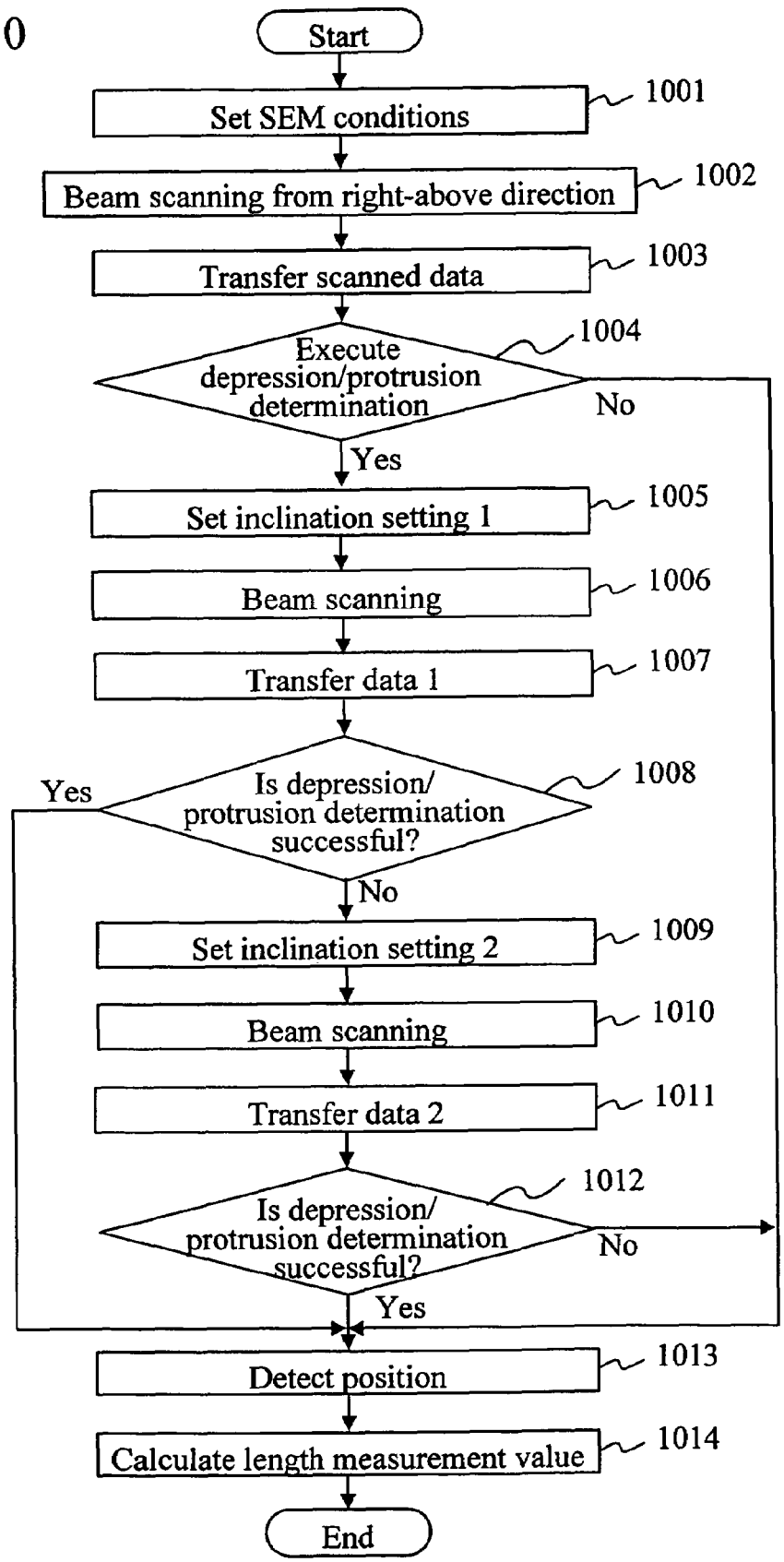
FIG. 10 is a processing flow in the case where the present invention is used for the position specification of a line or space.
Figure 11:
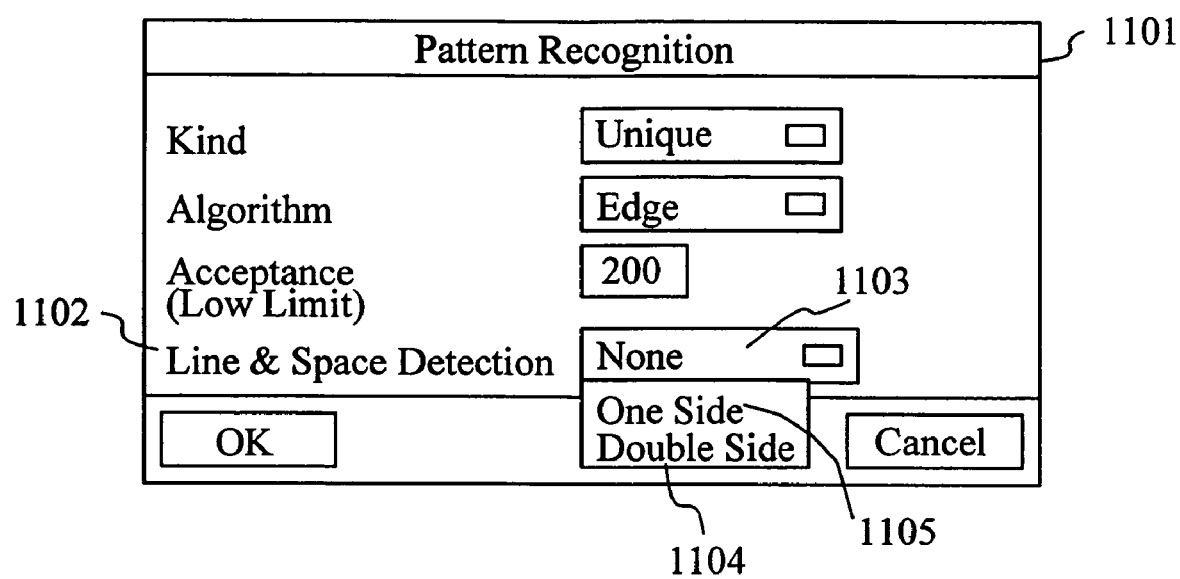
FIG. 11 is a view showing a configuration screen for pattern recognition conditions.

A processing flow in the case where the present invention is used for the position specification of the line or space in conducting the length measurement by the method for determining a depression/protrusion using the profiles taken from the right-above direction and from an either direction of the positive and negative directions, referring to FIG. 10 and FIG. 11.

At step 1001, the observation conditions of the scanning electron microscope (SEM) are set up, at step 1002 the beam is scanned from the right-above direction, and the profile or image is transferred to the image processor 309 as data 0 (step 1003). At this time, setting items: Conditions of Line & Space Detection (1102), None (1103), One Side (1105), and Double Side (1104) on a pattern recognition condition setting screen 1101 are referred to. Note that, these conditions are preset.

At step 1004 of the depression/protrusion determination execution, if None (1103) is specified, the depression/protrusion determination is bypassed and the position detection is executed using the data 0 (step 1013). If One Side (1105) or Double Side (1104) is specified, after setting an inclination setting 1 at step 1005, at step 1006 the beam is scanned, and the profile or image is transferred to the image processor 309 as data 1 (step 1007).

At step 1008, the depression/protrusion determination is performed using the data 0 and the data 1. The determination method at this time is the method described in FIG. 9. At step 1008, if the depression/protrusion determination was successful, the position detection is executed by using the depression-and-protrusion profile thus obtained (step 1013). If the depression/protrusion determination was unsuccessful, a beam inclination setting 2 wherein the beam is inclined at a certain angle of an opposite sign to that of the inclination setting 1 at step 1005 with reference to the original optical axis of the charged particle beam is set up (step 1009). After inclining the beam, the beam is scanned similarly to obtain the data, which are transferred to the image processor 309 as data 2 (steps 1010 and 1011). At step 1012, the depression/protrusion determination is performed using the data 1 and the data 2, and if the determination was successful, the position detection is executed using the depression/protrusion profile (step 1013).

If the determination was unsuccessful, the position detection is executed using one of the data 0, the data 1, the data 2, and composite data. After the position detection, a length measurement value is calculated (step 1014). By processing as described above, the data 0 used for calculating the length measurement value can be obtained while the beam irradiation is suppressed to a minimum level, and this leads to improvement in reproducibility of the length measurement. Further, a user can set up preliminary determination that the pattern is hard to distinguish the line area and the space area because the line width and the space width are almost the same at the time of registration, and thereby a damage of the pattern by the beam irradiation for a depression/protrusion determination can be avoided.

[Embodiment 8]

Figure 12:
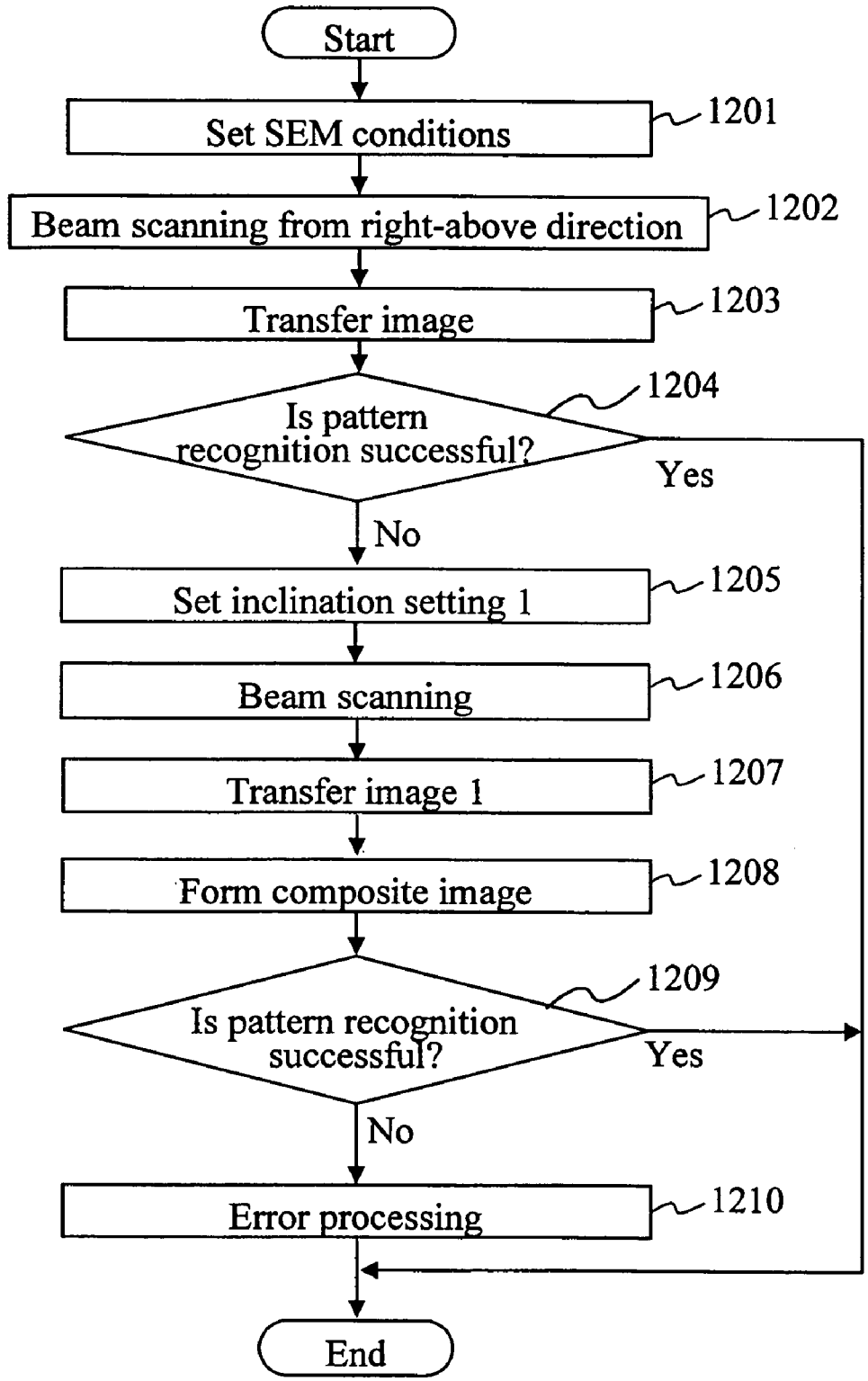
FIG. 12 is a processing flow in the case where the pattern recognition is conducted using an image obtained by inclination of the beam.

Next, a method for performing the pattern recognition by using the image taken with the inclined beam will be described referring to FIG. 12. At step 1201 observation conditions of the scanning electron microscope (SEM) are set up, at step 1202 the beam is scanned from the right-above direction, and the image 0 is transferred to the image processor 309 (step 1203). The image processor 309 executes the pattern recognition by referring to the templates that have been registered beforehand and using search algorithm such as normalized correlation (step 1204).

Whether or not the pattern recognition is successful is judged on the basis of a threshold value that has been set beforehand, and if successful, the pattern recognition is ended. If being judged to be unsuccessful, the beam is inclined so as to be in a direction having been set at the time of registration or in a direction obtained by calculation (step 1205) and is scanned to obtain an image 1 (step 1206). This is transferred to the image processor 309 (step 1207), and is subjected to superimposition with an image 0 taken with the non-inclined beam (step 1208). The superimposition may be addition of the image 0 and the image 1, or may be adoption of only the image 1.

By using the composite image, the pattern recognition is performed as in step 1204 (step 1209). Further, in this system, the pattern recognition can be performed only with the oblique image without executing steps 1202 through 1204. As described above, since the amount of information about the edge of the obtained image increases by performing the pattern recognition with the beam being inclined as mentioned above, pattern recognition can be done with a small number of frames, hence improving throughput. Moreover, since the amount of beam irradiation can be reduced, a damage due to the beam irradiation can be mitigated.

When specifying the inclination direction by calculation at the time of registration, the template image is differentiated in four directions consisting of the vertical direction (in the figure), a horizontal direction, and oblique directions, respectively, a sum of the derivatives for each direction is obtained, and a direction that makes 90 degrees to the direction giving a maximum sum is chosen. This is effective when the edges running in a specific direction dominate in the pattern.

[Embodiment 9]

Another method in which electron beam inclination is used for the pattern recognition will be described referring to FIG. 14. Normally, when performing image recognition using a template image for positioning etc., templates are registered beforehand and the image is subjected to matching with the templates at the time of inspection.

In the registration of a template, a region that acts as a template (1402) is selected on an image (1402) obtained by scanning from the right-above direction using the input means 312. This selected partial image is transferred to the image processor 309, and a directional image is calculated by using an operator for defining a direction (e.g., a Sobel filter etc.).

Next, a distribution map of the obtained direction image is formed, and an angle that is larger than a previously determined threshold value is found (plural angles may be found). Since this angle (or these angles) exhibits a distribution of pattern edges, if the electron beam is inclined so as to look at the side face of the edge, an image with increased amount of information can be obtained because of the edge effect. The numeral 1403 is an image obtained by inclining the electron beam to the right from the vertical direction in the incident plane, and the pattern (1404) is enhanced in the edges at the right hand side. That is, the pattern shape can be specified by extracting a portion in which the edge is enhanced.

The same processing can also be conducted for a plurality of directions including the vertical direction (on the figure), the horizontal direction, and the oblique directions. Further, if the same processing is applied to the line pattern running up to the upper and lower sides in the image, the directions may be only the horizontal direction and the oblique directions. The oblique image obtained as in the foregoing is registered, and template matching is conducted at the time of inspection. This system makes it possible to recognize the pattern of a small level difference with sufficient reliability. In the case where the pattern shape is known beforehand, if the beam is selectively inclined toward a direction in which the edge can be enhanced (ideally, a direction perpendicular to a longitudinal direction of the edge), the pattern edge can clarified without inclining the beam unnecessarily.

[Embodiment 10]

In the foregoing embodiments, a technology for determining a depression/protrusion on the sample on the basis of increase/decrease of the peak width of the line profile that was obtained by scanning the electron beam with its direction being declined was described. In this embodiment, an example in which the depression/protrusion determination of an image composed of a line and a space is performed by conducting signal measurement while a focal position of the electron beam is varied and comparing the focus evaluation values of the line area and the space area for respective images will be described.

Figure 16:
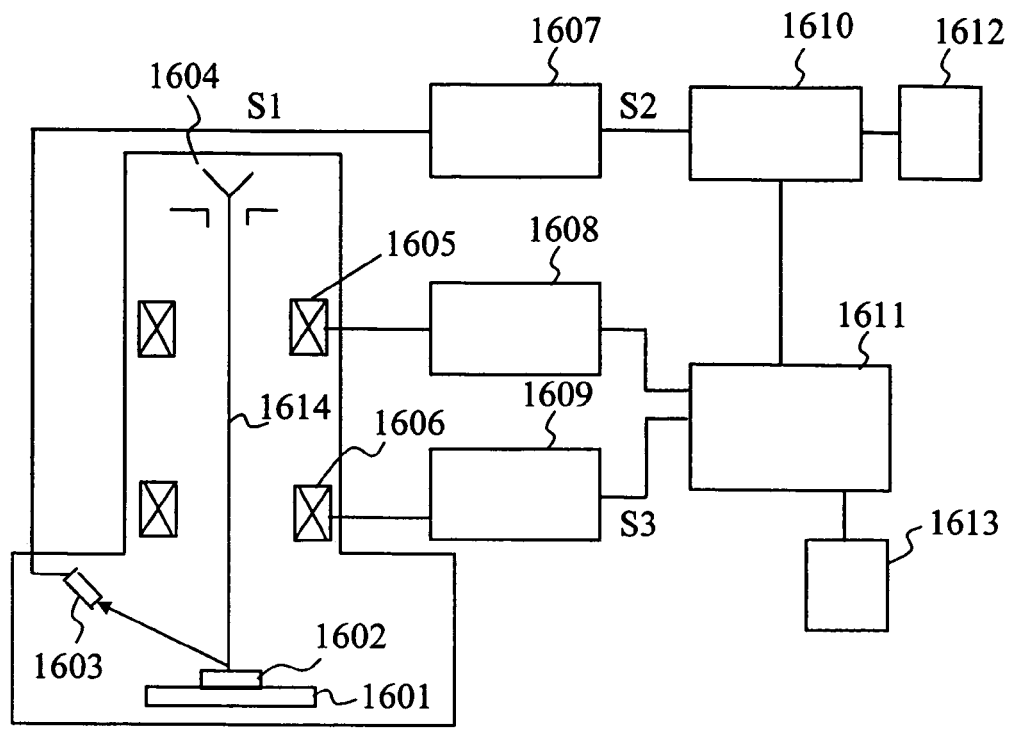
FIG. 16 is a schematic configuration diagram of a scanning electron microscope apparatus that is one embodiment according to the present invention.

FIG. 16 is a block diagram of a configuration outline of the scanning electron microscope equipment that is one embodiment of the image-processing apparatus according to the present invention. This scanning electron microscope is equipped with an autofocusing control function. In FIG. 16, the numeral 1601 represents a sample stage, 1601 is a sample whose image is to be taken on the sample stage, 1604 is a negative electrode, 1605 is a scanning coil, 1606 is an electron lens, 1608 is a scanning coil control circuit, and 1609 is a lens control circuit. An electron beam 1614 is scanned over the sample 1602 by means of the scanning coil 1605, and electrons emitted from the sample 1602 are detected by a detector 1603. A signal S1 from the detector 1603 is inputted into an AD converter 1607, and is converted to a digital signal S2. The digital signal S2 is inputted to an image processor 1610 to be subjected to image processing and extraction of a feature quantity, and the results are sent to a control computer 1611. Further, the processed image is sent to a display 1612 and is displayed thereon. A focus control signal S3 from the control computer 1611 is inputted into the lens control circuit 1609 to control the exciting current of the lens 1606, and thereby focus control can be conducted. The numeral 1613 represents input means connected to the control computer 1611.

An autofocusing control in the scanning electron microscope configured as described above is a control in which focusing conditions of the electron lens are set to optimum values automatically, and a method therefor is composed of the steps: conducting frame scanning for plural frames while the conditions of the electron lens is varied; calculating and evaluating the focus evaluation values from detected signals of the obtained secondary electrons and/or reflected electrons; and setting the optimum values for the conditions of the electron lens.

In manufacturing a semiconductor device, when measuring the line width of the fine pattern drawn on the wafer, the electron microscope apparatus is used. Here, when the portion on the wafer that is to be measured for its width is a line or a space, if the widths of the line and of the space are almost the same, it becomes difficult to distinguish the two features and it is necessary to distinguish them from three-dimensional information. Since the present invention relates to the charged particle beam apparatus capable of obtaining information of the depressions and protrusions of a line and space sample by means of a simple technique, it can be applied to the scanning electron microscope in FIG. 16.

Figure 17:
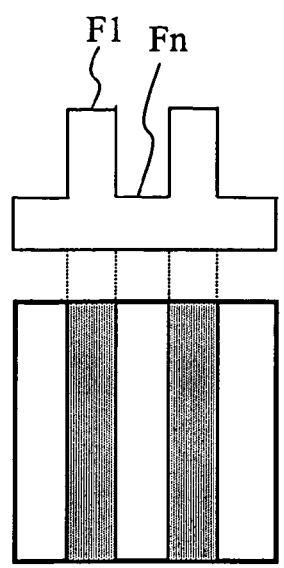
FIG. 17 is a view showing a case where depression/protrusion parts of a line and space pattern sample are in focus.

FIG. 17 is for illustrating the case where the depression/protrusion parts of the line and space sample are in focus. The reference character F1 indicates the case where the beam is focused on the line area (protrusion part) and Fn indicates the case where the beam is focused on the space area (depression part). Thus, since the depression part and the protrusion part have different focal positions, the depression/protrusion can be determined by using the information.

Figure 24:
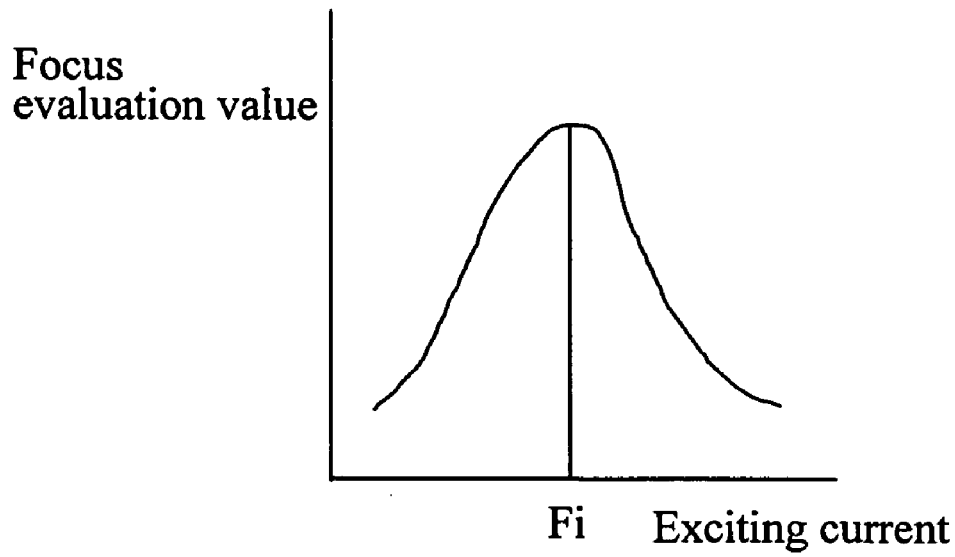
FIG. 24 is a view showing variation in the focus evaluation value when the exciting current of an electron lens is varied.

FIG. 24 is a view showing variation in the focus evaluation value when the exciting current of the electron lens is varied. Here, a derivative value between pixels, a secondary derivative value, a Sobel value, a Laplacian value, etc. are used for the focus evaluation value. When the focus evaluation value is calculated for each photographed image while changing conditions of the electron lens, the focus evaluation value takes a maximum under the conditions to establish the focusing. In FIG. 24, when the exciting current value of the electron lens is Fi, the focus evaluation value takes the maximum and hence Fi is the in-focus condition.

Figure 25:
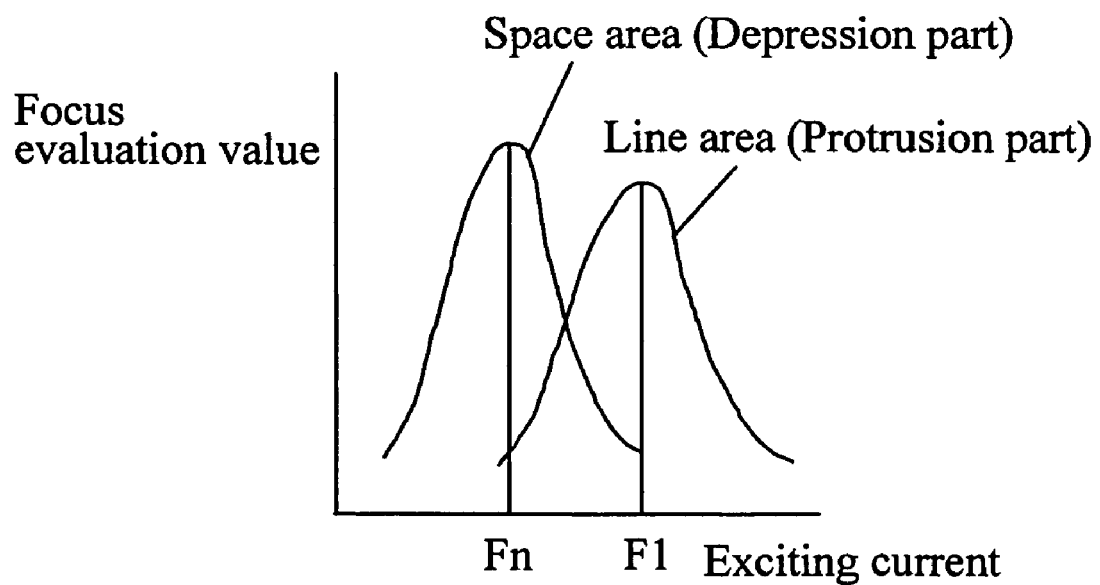
FIG. 25 is a view showing relationships between the exciting current and the focus evaluation value for the line area and for the space area.

FIG. 25 shows relationships between the exciting current and the focus evaluation value for the line area and for the space area. As explained in FIG. 24, since the focus evaluation value peaks under the in-focus condition, when the line area (protrusion part) is in focus, the focus evaluation value of the line area (protrusion part) become maximum but the focus evaluation value of the space area (depression part) becomes small because it goes out of focus. What is contrary to this can be mentioned for a case where the space area (depression part) is in focus.

Figure 26:
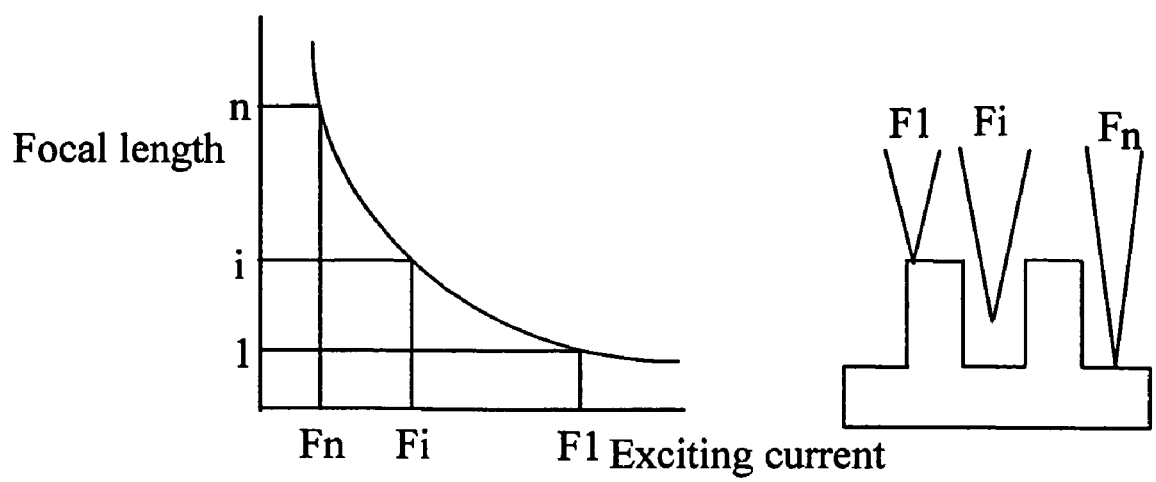
FIG. 26 is a view showing a relationship between the exciting current and the focal length.

The relationship between the exciting current and the focal length is shown in FIG. 26. As shown in FIG. 26, since the exciting current defines the focal length, knowledge of the exciting current at the time of being in focus enables assumption of the focal length from the value of the exciting current. That is, if the exciting currents at the time of being in focus are known for two different regions, heights of the two regions can be judged.

Figure 18:
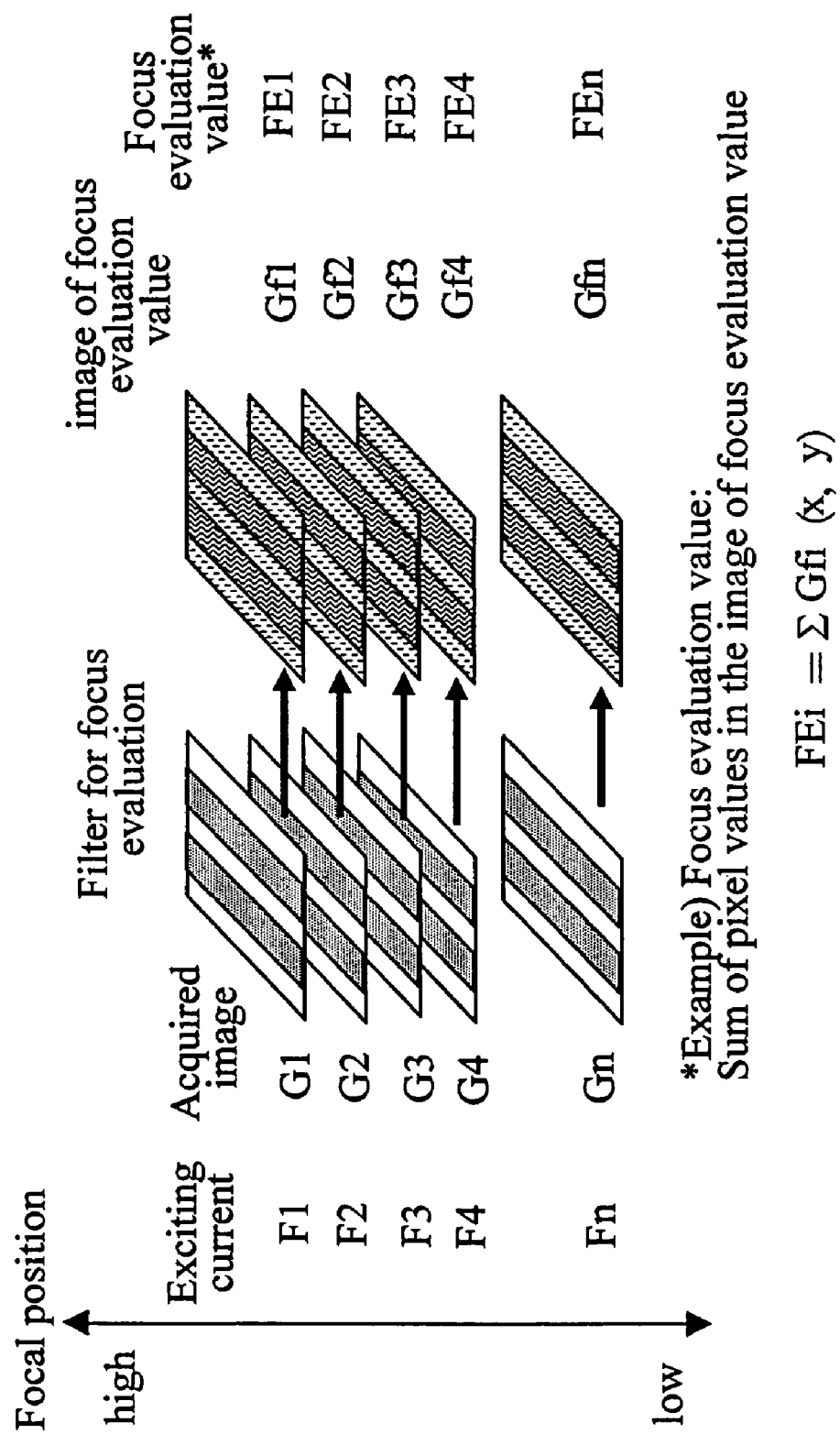
FIG. 18 is a schematic diagram illustrating the steps until focus evaluation values are calculated.

FIG. 18 shows a schematic diagram illustrating how the focus evaluation value is calculated. The exciting current is varied from F1 to Fn to change the focal position, and images G1 to Gn corresponding to respective currents are acquired. Next, the images G1 to Gn are subjected to an operation of a filter for focus evaluation (e.g., differentiation, secondary differentiation, Sobel, Laplacian, etc.), respectively, to form focus evaluation images Gf1 to Gf2, and focus evaluation values FE1 to FEn are calculated. Here, as the focus evaluation value, a sum of entire pixel values of the focus evaluation value image, its average, its variance, etc. can be used. Normally the process up to this step is executed as autofocusing, and the exciting current value that gives a maximum for each of the focus evaluation values FE1 to FEn is assumed as the exciting current of an in-focus state.

Figure 19:
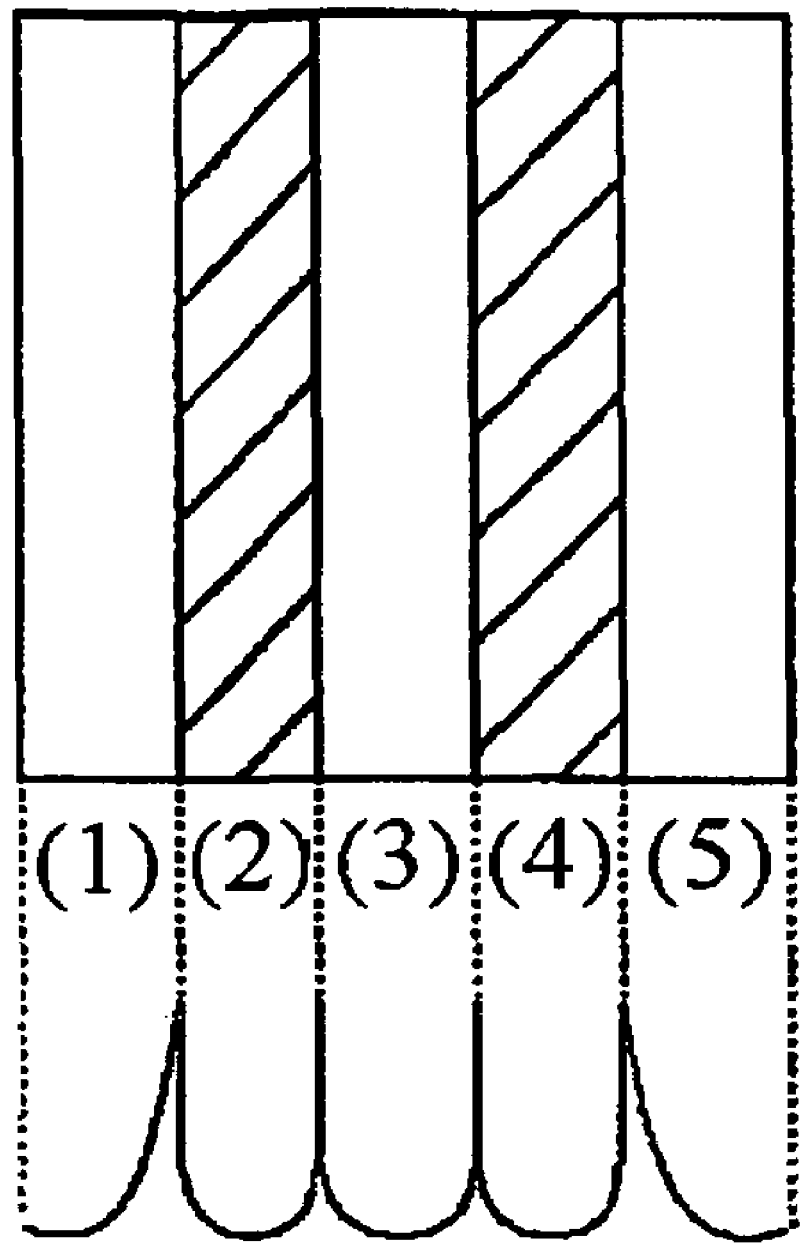
FIG. 19 is a view showing a projection waveform in the line and space image.

FIG. 19 shows the projection waveform in the line and space image. In the electron microscope image, an edge part of the line is enhanced with high brightness by the edge effect. Accordingly, the projection waveform exhibits a peak at the boundary of the line and the space as in FIG. 19, and hence an area sandwiched by the peaks is found to be the line or the space.

Figure 20:
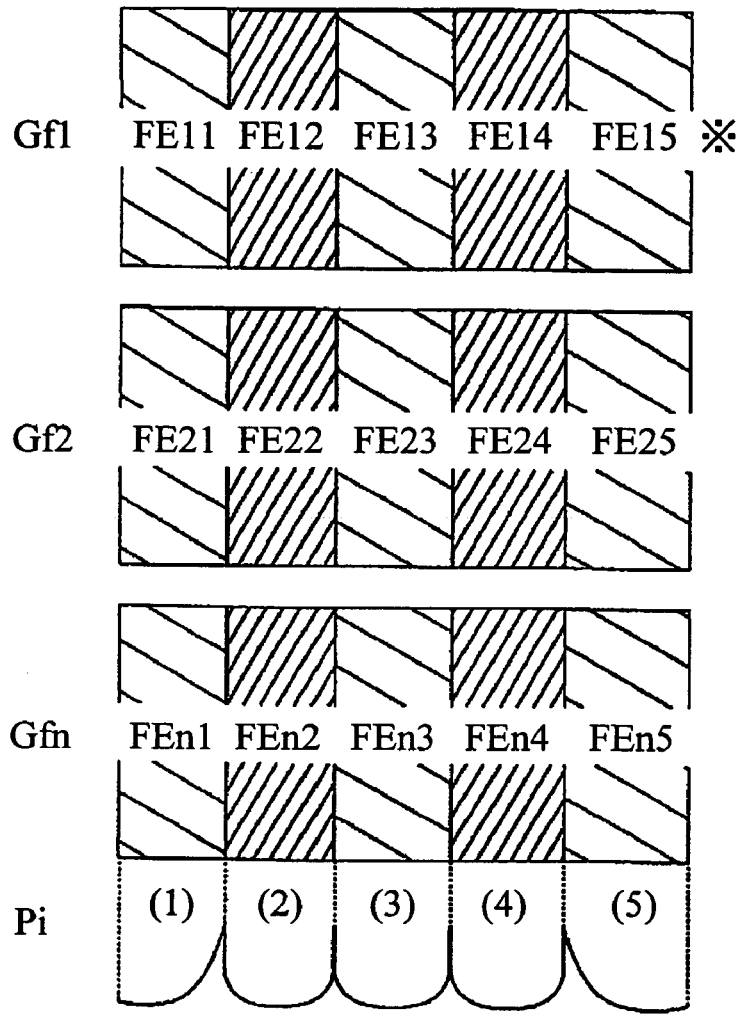
FIG. 20 is a view showing the method for calculating the focus evaluation value of a line area and a space area.

FIG. 20 shows a method for calculating the focus evaluation values of the line area and of the space area. As shown in FIG. 19, the projection waveform is obtained from the in-focus image taken by autofocusing, and regions (1) to (5) for each of which the focus evaluation value is to be calculated are determined. For each image of the focus evaluation value images Gf1 to Gfn, the focus evaluation values FE11 to FEn5 are calculated in the regions (1) to (5). Next, for the region (1), a maximum (FEi1) of FE11 to FEn1 is found, and the exciting current value of the region (1) of the in-focus state (Fi) is obtained from the exciting current corresponding to the maximum FEi1. Similar operations are carried out for the regions (2) to (5) to obtain the exciting currents of the in-focus state in the respective regions. From magnitudes of the focusing current values of the regions (1) to (5) of the in-focus state, the focal lengths for the respective regions are obtained, the heights of the regions are judged, and thereby a depression/protrusion is determined.

Figure 23:
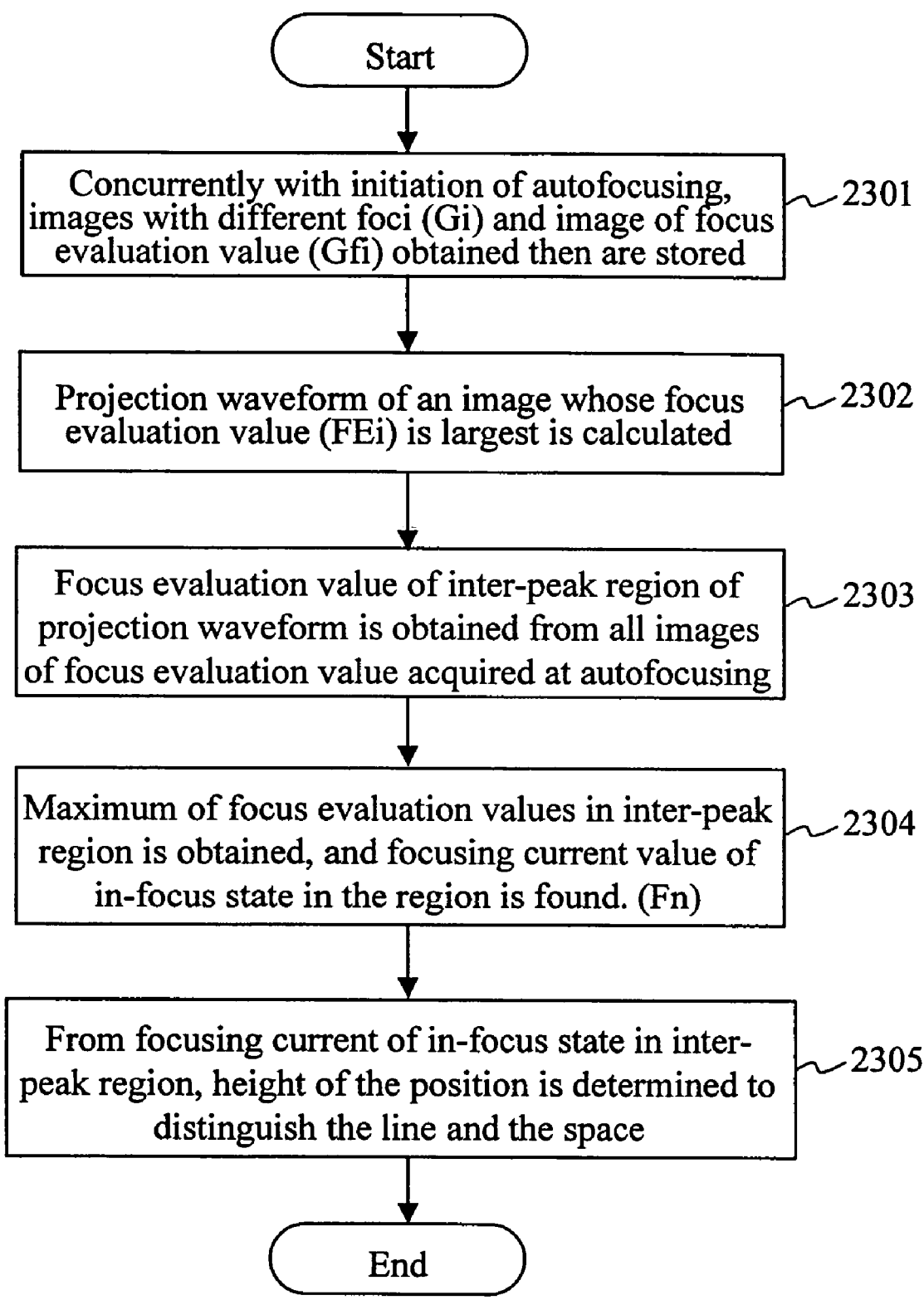
FIG. 23 is a view showing a processing flow that is one embodiment according to the present invention.

FIG. 23 shows a processing flow that is one embodiment according to the present invention. The numeral 2301 represents a step of obtaining images (Gi) of different foci and the focus evaluation image (Gfi) that were explained in FIG. 18, and this part can be executed in parallel with the autofocusing. The numeral 2302 represents a step of calculating the focus evaluation value explained in FIG. 19, obtaining an exciting current of the in-focus state, and obtaining the projection waveform from an image corresponding to that. The numeral 2303 represents a step of calculating the focus evaluation values (FEmn) for regions between positions corresponding to the peaks (inter-peak regions) (1) to (5) that were explained in FIG. 20. The numeral 2304 represents a step of finding the exciting current values of the in-focus state for the inter-peak regions (1) to (5) that were explained in FIG. 21. The numeral 2305 is a step of judging the heights of the regions (1) to (5) from the exciting currents obtained at step 2304 and determining a depression/protrusion.

Figure 21:
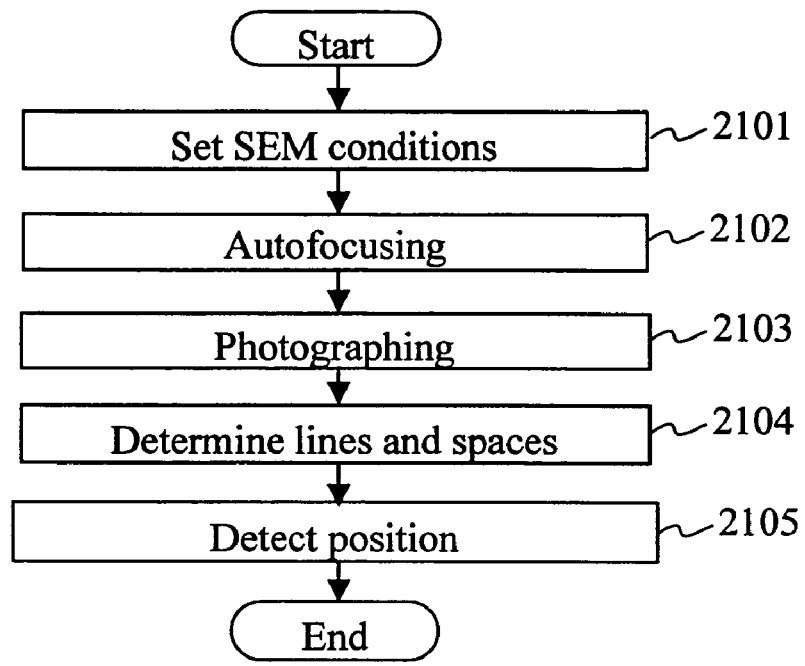
FIG. 21 is a view showing a processing method in which the present invention is used for the position specification of the line or space.

FIG. 21 is a processing flow in the case where the present invention is used for the position specification of the line or space when the length measurement is conducted in the line and space image. At step 2101 the measurement conditions of the scanning electron microscope (SEM) are set up, at step 2102 the autofocusing is executed, and at step 2103 an image is taken. At step 2104, the depression/protrusion determination is performed according to the processing flow shown in FIG. 23. Finally at step 2105, coordinates of the protrusion part are outputted if it is the line area; coordinates of the depression part are outputted if it is the space area. Here, if plural depression/protrusion parts were detected, coordinates for the one closest to the center may be outputted.

Figure 22:
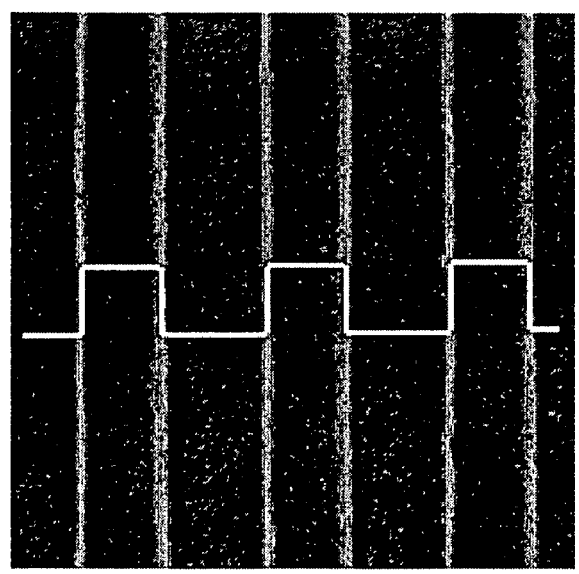
FIG. 22 is a view showing an example in which the obtained depression-and-protrusion profile is displayed superimposed on the photographed image.

FIG. 22 is an example of display in which the obtained depression-and-protrusion profile is displayed superimposed on the photographed image.

In this embodiment, the depression/protrusion determination of the line and space is performed by calculating the focus evaluation values for a portion corresponding to the line and space from the image obtained at the time of autofocusing, finding focal lengths from the exciting currents at the time of the in-focus state, and obtaining information of the depressions and protrusions of the image; therefore, the information of the depressions and protrusions can be obtained with a simple method without using complex image processing such as matching. Further, since the obtained information of the depressions and protrusions is used for the position determination, a specific error of length measurement points in the line and space image can be reduced. Moreover, since necessary information can be collected at the very timing of autofocusing, it is not necessary to introduce a new process for obtaining the information of the depressions and protrusions at other timing, and hence this method can contribute to improvement of throughput.

According to the present invention, the depression/protrusion determination on the sample can easily be implemented.

What is claimed is:

1. A charged particle beam apparatus, comprising:
a charged particle source;
a stage system that moves carrying a sample thereon under observation;
a scanning deflection system for scanning the charge particle beam emitted from said charged particle source over the sample;
a control system for changing a focal point of the charged particle beam emitted from said charged particle source; and
a detection system for detecting a signal obtained from an irradiated position of said sample by the charged particle beam,
the control system calculates a proiection waveform of a line-and-space pattern based on detected signals, calculates a plurality of focus evaluation values while the focus is varied between peaks of the calculated projection waveform, determines a relative height of the individual leaks based on the plurality of focus evaluation values obtained, and, based on the thus determined relative height information, distinguishes lines from spaces.

2. A charged particle beam apparatus according to claim 1, wherein an image obtained at the time of autofocusing or values thereof are used to calculate a focus evaluation value.

3. A charged particle beam apparatus according to claim 1, the charged particle beam apparatus being equipped with means for displaying information of depressions and protrusions in an obtained image of a line and space pattern superimposed on the photographed image as a profile waveform.

4. A charged particle beam apparatus according to claim 1, wherein information of depressions and protrusions in an obtained image of a line and space pattern is used to specify positions thereof.

* * * * *